US010090863B2

United States Patent
Tosato et al.

(10) Patent No.: US 10,090,863 B2
(45) Date of Patent: Oct. 2, 2018

(54) CODING AND DECODING METHODS AND APPARATUS

(71) Applicant: KABUSHIKI KAISHA TOSHIBA, Minato-ku (JP)

(72) Inventors: Filippo Tosato, Bristol (GB); Magnus Stig Torsten Sandell, Bristol (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/894,164

(22) PCT Filed: May 29, 2013

(86) PCT No.: PCT/GB2013/051421
§ 371 (c)(1),
(2) Date: Nov. 25, 2015

(87) PCT Pub. No.: WO2014/191705
PCT Pub. Date: Dec. 4, 2014

(65) Prior Publication Data
US 2016/0105202 A1    Apr. 14, 2016

(51) Int. Cl.
*H03M 13/37* (2006.01)
*H04L 1/00* (2006.01)
(Continued)

(52) U.S. Cl.
CPC ....... *H03M 13/373* (2013.01); *H03M 13/033* (2013.01); *H03M 13/1162* (2013.01);
(Continued)

(58) Field of Classification Search
CPC .................................................. H03M 13/151
(Continued)

(56) References Cited

U.S. PATENT DOCUMENTS 8,520,587 B2 * 8/2013 Menard ................. G01V 1/003
340/870.13
8,938,665 B2 * 1/2015 Mittelholzer ....... G06F 11/1004
714/807
(Continued)

FOREIGN PATENT DOCUMENTS

EP    1 976 166 A1    10/2008
JP    3-172026 A       7/1991
(Continued)

OTHER PUBLICATIONS

International Search Report and Written Opinion dated Feb. 5, 2014 in PCT/GB2013/051421.
(Continued)

*Primary Examiner* — Fritz Alphonse
(74) *Attorney, Agent, or Firm* — Oblon, McClelland, Maier & Neustadt, L.L.P.

(57) ABSTRACT

A decoder for decoding a received set of blocks each including a plurality of data symbols and a plurality of parity symbols, wherein the received set of blocks is a subset of a complete set of blocks, the complete set of blocks including at least one erased block not included in the received set of blocks, the decoder including: a storage for a coding matrix which is the kronecker product of a totally non-singular matrix with an antidiagonal matrix; and a processor operable to determine data symbols of the at least one erased block using the encoding matrix.

13 Claims, 5 Drawing Sheets

(51) Int. Cl.
H03M 13/03 (2006.01)
H03M 13/11 (2006.01)
H03M 13/00 (2006.01)

(52) U.S. Cl.
CPC ..... *H03M 13/3761* (2013.01); *H03M 13/616* (2013.01); *H04L 1/0057* (2013.01); *H04L 1/0076* (2013.01); *H04L 2001/0097* (2013.01)

(58) Field of Classification Search
USPC ........ 714/781, 776, 752, 758, 780, 782, 784
See application file for complete search history.

(56) References Cited

U.S. PATENT DOCUMENTS

| | | | |
|---|---|---|---|
| 2005/0185734 A1* | 8/2005 | Hottinen | H04L 1/0643 375/295 |
| 2007/0300127 A1 | 12/2007 | Watson et al. | |
| 2008/0301534 A1 | 12/2008 | Zheng | |
| 2009/0132894 A1 | 5/2009 | Xu et al. | |
| 2011/0258510 A1 | 10/2011 | Watson et al. | |
| 2011/0299629 A1* | 12/2011 | Luby | H03M 13/3761 375/299 |
| 2012/0331367 A1 | 12/2012 | Blaum et al. | |
| 2013/0283116 A1* | 10/2013 | Arikan | H03M 13/13 714/752 |

FOREIGN PATENT DOCUMENTS

| | | |
|---|---|---|
| JP | 2001-518665 A | 10/2001 |
| WO | WO 99/17217 A1 | 4/1999 |
| WO | WO 2007/134196 A2 | 11/2007 |

OTHER PUBLICATIONS

International Preliminary Report on Patentability dated Dec. 1, 2015 in PCT/GB2013/051421.

Miroslav Fiedler, et al., "A factorization of totally nonsingular matrices over a ring with identity" Linear Algebra and its Applications, vol. 304, XP055098430, 2000, pp. 161-171.

Japanese Office Action dated Dec. 20, 2016 in Patent Application No. 2016-516230.

Magnus Sandell, et al., "Lowest-Density MDS Array Codes for Reliable Smart Meter Networks" Transactions on Emerging Telecommunications Technologies, Feb. 16, 2015, pp. 1251-1264 and cover page.

Magnus Sandell, et al., "Lowest Density MDS Array Codes on Incomplete Graphs" Communication, Control, and Computing (Allerton), 51$^{st}$ Annual Conference, Oct. 4, 2013, pp. 645-652 and cover pages.

X.-H. Peng, "Erasure-control coding for distributed networks", IEE Proceedings on Communications, vol. 152 No. 6, Dec. 2005, pp. 1075-1080.

Ahmed Badr, et al., "Diversity Embedded Streaming Erasure Codes (DE-SCo): Constructions and Optimality", IEEE Journal on Selected Areas in Communications, vol. 29 No. 5, May 2011, pp. 1-12.

Hsiao-Ying Lin, et al., "A Secure Decentralized Erasure Code for Distributed Networked Storage," IEEE Transactions on Parallel and Distributed Systems, vol. 21 No. 11, Nov. 2010, pp. 1586-1594.

Mario Blaum, et al., "EVENODD: An Efficient Scheme for Tolerating Double Disk Failures in RAID Architectures", IEEE Transactions on Computers, vol. 44 No. 2, Feb. 1995, pp. 192-202.

Erez Louidor, et al., "Lowest-Density MDS Codes Over Extension Alphabets," IEEE Transactions on Information Theory, vol. 52, Jul. 2006, pp. 1-29.

Lihao Xu, et al., "Low-Density MDS Codes and Factors of Complete Graphs", IEEE Transactions of Information Theory, Sep. 1999, vol. 45 No. 6, pp. 1817-1826.

Ron M. Roth, et al., "On Generator Matrices of MDS Codes", IEEE Transactions on Information Theory, vol. 31 No. 6, Nov. 1985, pp. 826-830.

F. J. MacWilliams et al., "MDS Codes", The theory of error-correcting codes, North Holland Mathematical Library, 2006, pp. 317-331.

* cited by examiner

US 10,090,863 B2

CODING AND DECODING METHODS AND APPARATUS

FIELD

Embodiments described herein relate generally to methods and apparatus for encoding and decoding using erasure codes and to methods and apparatus for generating erasure codes.

BACKGROUND

Erasure coding involves the introduction of redundancy in coding schemes which makes it possible to reconstruct data that is lost through erasures.

There are many applications of erasure codes including distributed networks in which erasure codes are used to cope with high packet loss; video streaming over lossy channels; distributed network storage and redundant disk drives.

One application of erasure codes is in distributed sensor networks, for example, the monitoring of energy usage. It is envisaged that the modernisation of the existing energy grid to form the so called 'Smart Grid' will allow real-time information exchange between the utility provider and consumers to achieve more efficient energy management. Wireless sensor networks are likely to be employed for monitoring consumers' energy consumption and communicating it to the utility provider.

BRIEF DESCRIPTION OF THE DRAWINGS

In the following, embodiments are described, by way of example only, with reference to the accompanying drawings in which.

DETAILED DESCRIPTION

Figure 1:
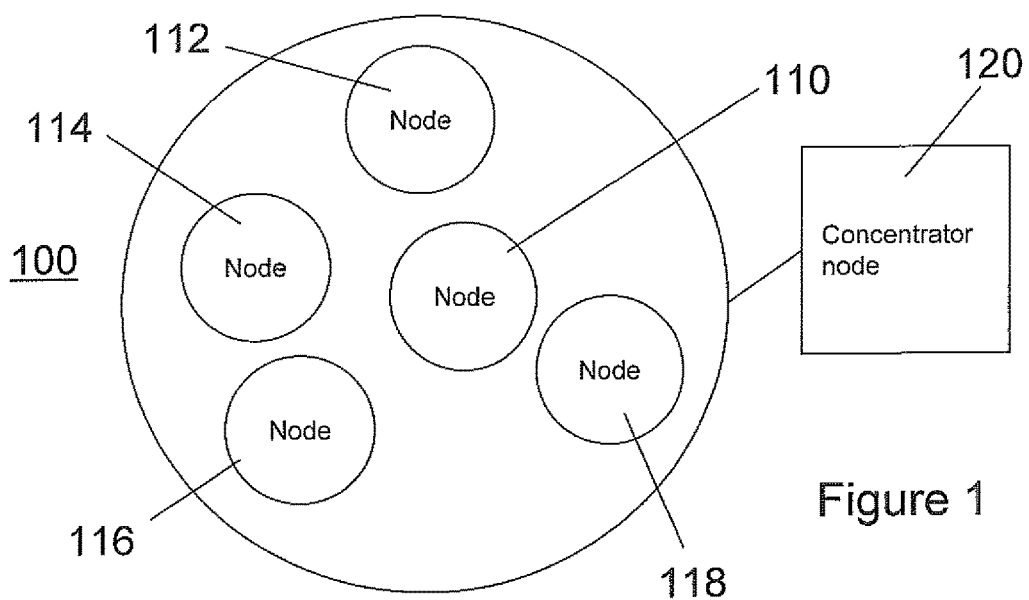
FIG. 1 shows a wireless sensor network according to an embodiment.

According to an embodiment a decoder for decoding a received set of blocks of a block erasure code comprises storage for a coding matrix which is the kronecker product of a totally non-singular matrix with an antidiagonal matrix; and a processor operable to determine data symbols of at least one erased block using the coding matrix. The blocks each comprises a plurality of data symbols and a plurality of parity symbols. The received set of blocks is a subset of a complete set of blocks, the complete set of blocks comprises the at least one erased block which is not included in the received set of blocks.

In an embodiment the processor is operable to determine the data symbols of the at least one erased block by calculating the inverse of the coding matrix.

In an embodiment the processor is operable to determine rows and columns of the coding matrix corresponding to the at least one erased block and to determine the data symbols of the at least one erased block by calculating the inverse of a matrix formed from the rows and columns of the coding matrix corresponding to the at least one erased block.

In an embodiment the decoder is part of a concentrator node of a sensor network. The sensor network comprises a plurality of nodes. Each node of the plurality of nodes is operable to generate blocks comprising a plurality of data symbols and a plurality of parity symbols, and to send the generated blocks to the concentrator node.

In an embodiment the decoder is operable to determine the number of nodes in the plurality of nodes and to generate the coding matrix taking into account the number of nodes in the plurality of nodes.

In an embodiment the decoder is operable to send an indication of the generated coding matrix to each node of the plurality of nodes.

In an embodiment the decoder further comprises storage for a plurality of coding matrices and wherein the decoder is operable to determine the number of nodes in the plurality of nodes and to select the coding matrix from the plurality of coding matrices taking into account the number of nodes in the plurality of nodes.

In an embodiment the decoder is further operable to send an indication of the selected coding matrix to each node of the plurality of nodes.

According to an embodiment an encoder is configured to set parity symbols of a block of a plurality of blocks of an erasure code using combinations of data symbols of other blocks of the plurality of blocks selected according to a column of an coding matrix which is the kronecker product of a totally non-singular matrix with an antidiagonal matrix.

In an embodiment the encoder further comprising a communication module configured to receive at least part of the coding matrix.

In an embodiment the encoder further comprises storage for a plurality of coding matrices, wherein the encoder is configured to select a coding matrix from the plurality of coding matrices for setting the parity symbols of the block.

In an embodiment the encoder further comprises a communication module configured to receive an indication of a coding matrix from the plurality of coding matrices, and the encoder is configured to select the coding matrix from the plurality of coding matrices for setting the parity symbols of the block according to the indication.

In an embodiment a sensor of a sensor network comprises the encoder.

In an embodiment a smart meter comprises the encoder.

In an embodiment method of decoding a received set of blocks comprises determining the data symbols of at least one erased block using an encoding matrix which is the kronecker product of a totally non-singular matrix with an antidiagonal matrix.

In an embodiment method of encoding a block of a plurality of blocks of an erasure code, comprises setting the parity symbols of the block using combinations of data symbols of other blocks of the plurality of blocks selected according to a column of an encoding matrix which is the kronecker product of a totally non-singular matrix with an antidiagonal matrix.

In an embodiment a method of generating a block erasure code comprises calculating a coding matrix indicating calculation of parity symbols for each block from data symbols of other blocks as the kronecker product of a totally non-singular (k×r) matrix and an (m+p)×(m+p) antidiagonal matrix. Blocks encoded by the erasure code each comprise m data symbols and p parity symbols such that all of the data symbols of a set of blocks encoded by the erasure code can be retrieved from the k surviving blocks in the event that r blocks are erased.

Embodiments provide a computer program product comprising computer executable instructions which, when executed by a processor, cause the processor to perform methods as set out above. The computer program product may be embodied in a carrier medium, which may be a storage medium or a signal medium. A storage medium may include optical storage means, or magnetic storage means, or electronic storage means.

The described embodiments can be incorporated into a specific hardware device, a general purpose device configured by suitable software, or a combination of both. Aspects can be embodied in a software product, either as a complete software implementation, or as an add-on component for modification or enhancement of existing software (such as a plug in). Such a software product could be embodied in a carrier medium, such as a storage medium (e.g. an optical disk or a mass storage memory such as a FLASH memory) or a signal medium (such as a download). Specific hardware devices suitable for the embodiment could include an application specific device such as an ASIC, an FPGA or a DSP, or other dedicated functional hardware means. The reader will understand that none of the foregoing discussion of embodiment in software or hardware limits future implementation of the invention on yet to be discovered or defined means of execution.

FIG. 1 shows a wireless sensor network according to an embodiment. The wireless sensor network 100 has a plurality of nodes 110, 112, 114, 116 and 118 and a concentrator node 120. Each of the nodes 110, 112, 114, 116 and 118 is a meter in a residential and/or business property. The nodes 110, 112, 114, 116 and 118 monitor consumers' energy consumption and communicate it to the utility provider. The nodes 110, 112, 114, 116 and 118 report their consumption to the concentrator node 120 which is located nearby. Communication between the nodes and/or the concentrator node is wireless, using technology such as IEEE802.11n.

The monitoring of energy usage can be very frequent, for example in the order of seconds, whereas the data gathering by the concentrator node is less frequent, for example in the order of hours or days. This means that data is accumulated and stored at the houses, that is, the nodes in the network and released to the concentrator node upon request. However if all communication is wireless, houses might only be intermittently connected to the concentrator node. At a given time, there is a chance that no reliable communication link is available. In that case, it would be desirable to obtain the data from all nodes by communicating with only a subset of them. This is possible if redundancy is introduced in the network, i.e., the data from one node is stored at one or more other nodes. With an adequate scheme, it could be possible to retrieve the data from all n nodes from only k of them. Another advantage could be that the concentrator node only needs to contact k nodes, even if communication with all nodes is possible.

This can be achieved by employing erasure coding, which makes it possible to reconstruct all the data even if some observations are erased. This is the case if some houses are not able to communicate with the concentrator node. A suitable code is a vertical array code, which is illustrated in FIG. 2.

Figure 2:
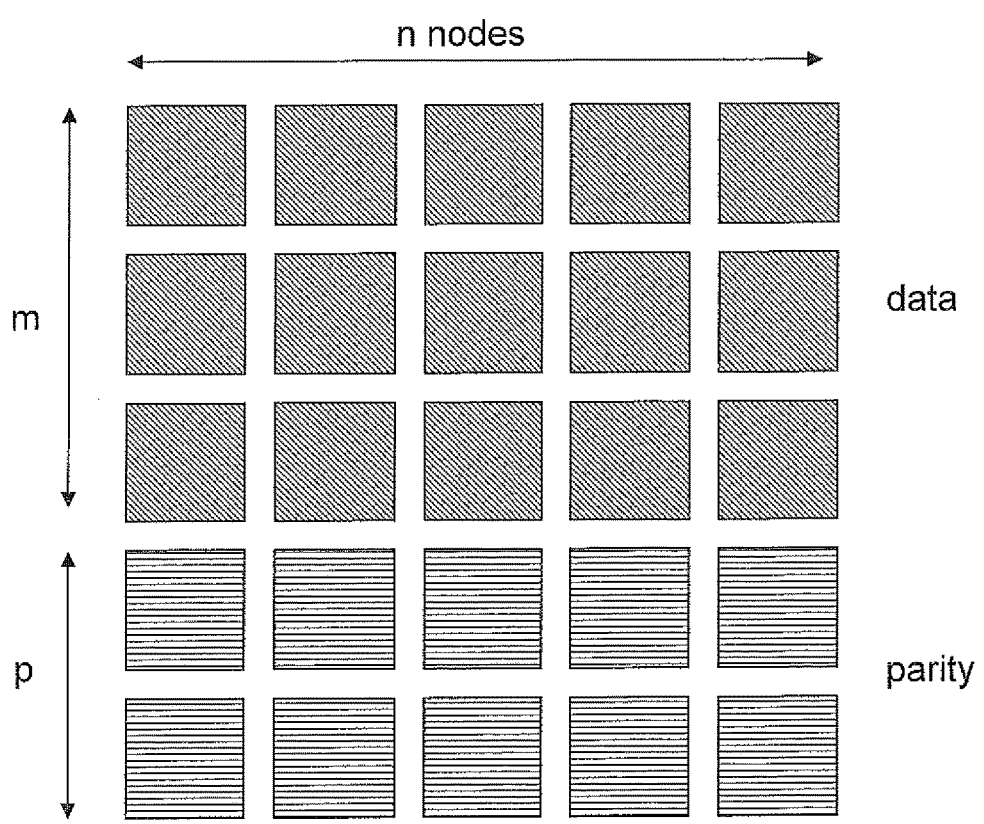
FIG. 2 shows a vertical array erasure code used in an embodiment.

FIG. 2 shows a vertical array code according to an embodiment. Each column represents a node in the network and consists of its own data and parity symbols for data from other nodes. If there are n nodes, the data should be possible to reconstruct from knowing only k of the columns. If the erasure code can correct the maximum number of erased symbols given the redundancy, the code is said to be maximal-distance separable (MDS). It is also important that the parity symbols are a function of as few data symbols as possible, since this minimises the number of data packets needed to be exchanged between the nodes. Erasure codes with this property are called low density.

The way the erasure code works in the context of the sensor network is that each node in the network would generate its own data indicating energy consumption. The node would then share the data with the other nodes in order to have copies of the data in case the node would fail.

Note that all data from one node could simply be copied in full to r other nodes; since the data would then exist in r+1 nodes, the network can cope with r of them failing as at least one copy would survive. However this is an inefficient way of being resilient to node failures; better codes can be designed that can achieve the same level of erasure correction but with much less redundancy and storage. When the concentrator node needs the data from the network, it suffices to connect to k of the n nodes; due to the erasure code the data from the n−k failed nodes can be reconstructed. This is done by using the known dependencies of the data on the parity symbols in the k surviving nodes.

Consider a network with n nodes, each generating m information messages and p parity messages. These m+p messages stored in node i correspond to the i-th column of the vertical array code of FIG. 2. Mathematically, the code of FIG. 2 is defined on a (m+p)×n matrix of the form:

$$\begin{pmatrix} d_{1,1} & \cdots & d_{1,n} \\ \vdots & \ddots & \vdots \\ d_{m,1} & \cdots & d_{m,n} \\ f_{1,1} & \cdots & f_{1,n} \\ \vdots & \ddots & \vdots \\ f_{p,1} & \cdots & f_{p,n} \end{pmatrix} \quad (1)$$

where $d_{i,j}$ and $f_{i,j}$ are the data and parity symbols, respectively, taken from a finite field GF(q) where q=b' is a power of a prime number b.

Let r=n−k be the maximum number of erasures, i.e., node failures that the code is able to correct. In order for the code to be MDS the following relationship between the parameters r, k, m and p must be satisfied, which is derived by imposing that the minimum distance between code words is maximised $$pk = mr \quad (2)$$

It is useful to represent the array code (1) as a one dimensional linear code of size n(m+p), such that the encoding operation can be written as a vector-matrix multiplication $$c = dG \quad (3)$$

where c is the codeword $$c = (d_{11} \ldots d_{m1}\, d_{12} \ldots d_{mn}\, f_{11} \ldots f_{p1}\, f_{12}) \quad (4)$$

d is the vector of data symbols $$d = (d_{1,1} \ldots d_{m,1}\, d_{1,2} \ldots d_{m,n}) \quad (5)$$

and G is the nm×n(m+p) generator matrix $$G = \begin{pmatrix} I_m & 0 & \cdots & 0 & A_{1,1} & \cdots & A_{1,n} \\ 0 & I_m & \cdots & 0 & A_{2,1} & \cdots & A_{2,n} \\ \vdots & \vdots & \ddots & \vdots & \vdots & \ddots & \vdots \\ 0 & \cdots & \cdots & I_m & A_{n,1} & \cdots & A_{n,n} \end{pmatrix} \quad (6)$$

In this representation the generator matrix is arranged in systematic form: $G = (I_{mm}|A)$, where the non-systematic part, A, is partitioned in blocks of size m×p, $A = [A_{i,j}]_{i,j=1}^n$.

Therefore the code design problem is equivalent to designing the nm×np matrix A in such a way that the following properties are satisfied:

1. MDS property. For any failure of up to r nodes, i.e., any erasure combination of up to r columns of (1) it is possible to recover all the nm information messages from k of the surviving nodes
2. Lowest density property. There are exactly r nonzero entries in each row of A and k nonzero entries in each column of A, which yields a generator matrix with the lowest possible density of nonzero elements.
3. Finite alphabet. The nonzero entries of A belong to a finite field GF(q).
4. Generality of design. The construction is applicable to any number of nodes n and node failures r.

Unlike other designs available in the literature of MDS codes, our construction encompasses all the above properties.

The construction of A is given as follows $$A = S \otimes D \quad (7)$$

where D is an anti-diagonal (m+p)×(m+p) matrix defined as $$D_{i,j} = \begin{cases} 1 & i+j = m+p+1 \\ 0 & \text{otherwise} \end{cases}, \quad i, j = 1, \cdots, m+p \quad (8)$$

⊗ denotes the Kronecker product and S is a k×r totally non-singular matrix, such that any l×l sub-matrix of S is non-singular, with 1≤l≤min(k,r). As an example of totally non-singular matrices, we can choose S to be a Singleton matrix. Singleton matrices have the additional benefit of being the totally non-singular matrices with the smallest alphabet for a given size of the matrix.

Node Permutations.

By applying a permutation to the nodes, i.e., relabeling of the nodes, which translates to a row and column permutation on matrix A, we can obtain a different code with the same optimal properties. In total, there are n! such permutations.

Duality.

It can be shown that once an MDS code has been designed for n nodes, k=n−r minimum number of surviving nodes, m information messages per node and p parity messages per node, the same construction can be used for the "dual" code, which is also lowest density MDS. The dual code is characterised by the same number of nodes n but the role of k and r is exchanged and the parameters m and p are also exchanged.

Extension to m and p not Co-Prime.

Once we have constructed MDS codes for the case m and p are co-prime, we can easily extend the codes for any multiple am and ap, with a positive integer. The extended codes are derived by simply re-using the mother code a times. Hence, the generator matrix, $G_a$, of the extended code is given by $$G_a = G \otimes I_a \quad (9)$$

where G is the generator matrix of the original code and $I_a$ is the a×a identity matrix.

An advantage of using construction (9) instead of directly (7) is that the same encoding and decoding operations can be repeated a times instead of having ap different encoding operations per node and a single decoding system of size ram (for Hailed nodes).

Encoding.

The encoding operation consists in generating the parity messages for each of the n nodes. Each parity message is obtained by a linear combination of k data messages provided by other nodes. The multiplications and additions are carried out in GF(q). In particular, the p parity messages for node i are given by $$(f_{1,i} \cdots f_{p,i}) = d \begin{pmatrix} A_{1,i} \\ \vdots \\ A_{m,i} \end{pmatrix}, \quad i = 1, \ldots, p \quad (10)$$

Decoding.

The decoding operation consists in retrieving all the data messages in the event of up to r node failures. Let $\mathcal{F} = \{i_1, \ldots, i_r\}$ be the set of failing nodes and $S = \{1, \ldots, n\} \backslash \mathcal{F} = \{i_{r+1}, \ldots, i_n\}$ the set of surviving nodes. The data messages generated by the k surviving nodes can be retrieved directly from these nodes, let these mk messages be grouped as:

$$d_s = (d_{1,i_{r+1}} \ldots d_{m,i_{r+1}}\, d_{1,i_{r+2}} \ldots d_{m,i_n}) \quad (11)$$

while the remaining mr messages, originated in the failed nodes, form $$d_f = (d_{1,i_1} \ldots d_{m,i_1}\, d_{1,i_2} \ldots d_{m,i_r}) \quad (12)$$

Accordingly the k block columns of the non-systematic part of the generator matrix corresponding to the surviving nodes can be partitioned as follows $$A_s = [A_{i,j}]_{i,j \in S} \quad (13)$$

$$A_f = [A_{i,j}]_{i \in F, j \in S} \quad (14)$$

Note that $A_f$ is square because mr=pk from (2). The pk parity messages of the surviving nodes can be written as follows $$f_s = (f_{1,i_{r+1}} \ldots f_{p,i_{r+1}}\, f_{1,i_{r+2}} \ldots f_{p,i_n}) \quad (15)$$

such that $$f_s = d_s A_s + d_f A_f \quad (16)$$

Therefore, we can solve (16) for the unknowns $d_f$ $$d_f = (f_s - d_s A_s) A_f^{-1} \quad (17)$$

It can be shown that with the construction (7) the matrix $A_f$ is always non-singular. It is noted that because of the sparse nature of matrix $A_f$, in practice, calculation of (17) can be done in a simplified fashion by solving a number of subsystems that require at most inverting matrices of size min{k,r}.

The decoding algorithm can be formulated in pseudo language as follows

---
Algorithm 1. Decoding of the MDS code
---
Initialise: i = 1, $x_j$ = 0, j = 1,...,kp
while i ≤ kp do
  if $x_i$ = 0 then
    Find all nonzero columns, $\tau_c$ = {j|$A_f$(i,j) ≠ 0}, and rows,
    $\tau_r$ = {l|$A_f$(l,j) ≠ 0, j ∈ $\tau_c$}.
    Solve the |$\tau_r$| × |$\tau_c$| system of equations for the variables $d_{t,u}$, with
    m(u − 1) + t = l, l ∈ $\tau_r$, and u ∈ $\Im$, 1 ≤ t ≤ m.
    Mark the variables as solved by setting $x_l$ = 1, l ∈ $\tau_r$.
  end if
  i ← i + 1
end while

---

In case less than r nodes fail, hence there are more than k surviving nodes, (17) still applies, where only k of the surviving nodes are used by the concentrator node to retrieve all the information. This reduces the amount of data and parity messages that have to be transferred to the concentrator node. Alternatively, data and parity messages can be collected from all the surviving nodes and (17) still applies with the inverse replaced by the Moore-Penrose pseudo-inverse.

As an example, consider a network with n=5 nodes, a maximum of r=n−k=2 node failures, m=3 and p=2. The condition (2) is satisfied so a lowest density MDS code can be designed using construction (7) as follows $$A = \begin{pmatrix} 1 & 1 \\ 1 & 4 \\ 1 & 3 \end{pmatrix} \otimes \begin{pmatrix} 0 & 0 & 0 & 0 & 1 \\ 0 & 0 & 0 & 1 & 0 \\ 0 & 0 & 1 & 0 & 0 \\ 0 & 1 & 0 & 0 & 0 \\ 1 & 0 & 0 & 0 & 0 \end{pmatrix} \quad (18)$$

$$= \begin{pmatrix} 0 & 0| & 0 & 0| & 1 & 0| & 0 & 0| & 0 & 1 \\ 0 & 0| & 0 & 1| & 0 & 0| & 0 & 0| & 1 & 0 \\ 0 & 0| & 1 & 0| & 0 & 0| & 0 & 1| & 0 & 0 \\ \overline{0} & \overline{1}| & \overline{0} & \overline{0}| & \overline{0} & \overline{0}| & \overline{1} & \overline{0}| & \overline{0} & \overline{0} \\ 1 & 0| & 0 & 0| & 0 & 1| & 0 & 0| & 0 & 0 \\ 0 & 0| & 0 & 0| & 1 & 0| & 0 & 0| & 0 & 4 \\ \overline{0} & \overline{0}| & \overline{0} & \overline{1}| & \overline{0} & \overline{0}| & \overline{0} & \overline{0}| & \overline{4} & \overline{0} \\ 0 & 0| & 1 & 0| & 0 & 0| & 0 & 4| & 0 & 0 \\ 0 & 1| & 0 & 0| & 0 & 0| & 4 & 0| & 0 & 0 \\ \overline{1} & \overline{0}| & \overline{0} & \overline{0}| & \overline{0} & \overline{4}| & \overline{0} & \overline{0}| & \overline{0} & \overline{0} \\ 0 & 0| & 0 & 0| & 1 & 0| & 0 & 0| & 0 & 3 \\ 0 & 0| & 0 & 1| & 0 & 0| & 0 & 0| & 3 & 0 \\ \overline{0} & \overline{0}| & \overline{1} & \overline{0}| & \overline{0} & \overline{0}| & \overline{0} & \overline{3}| & \overline{0} & \overline{0} \\ 0 & 1| & 0 & 0| & 0 & 0| & 3 & 0| & 0 & 0 \\ 1 & 0| & 0 & 0| & 0 & 3| & 0 & 0| & 0 & 0 \end{pmatrix} = [A_{i,j}]_{i,j=1}^{5}$$

The A matrix can be partitioned in blocks of size m×p, of which there are n in each column and row.

In this example the alphabet size is q=5, therefore all the encoding and decoding operations are carried out in GF(5). The parity symbols of (1) becomes $$f_{1,1} = d_{2,2} + d_{1,4} + d_{3,5}$$

$$f_{2,1} = d_{1,2} + d_{3,3} + d_{2,5}$$

$$f_{1,2} = d_{3,1} + d_{2,3} + d_{1,5}$$

$$f_{2,2} = d_{2,1} + d_{1,3} + d_{3,4}$$

$$f_{1,3} = d_{1,1} + d_{3,2} + d_{2,4}$$

$$f_{2,3} = d_{2,2} + 4d_{1,4} + 3d_{3,5}$$

$$f_{1,4} = d_{1,2} + 4d_{3,3} + 3d_{2,5}$$

$$f_{2,4} = d_{3,1} + 4d_{2,3} + 3d_{1,5}$$

$$f_{1,5} = d_{2,1} + 4d_{1,3} + 3d_{3,4}$$

$$f_{2,5} = d_{1,1} + 4d_{3,2} + 3d_{2,4}$$

Encoding.

A node i, b=1, . . . , 5, generates each of its p=2 parity check messages by simply calculating a linear combination of 3 data messages received from other nodes, according to (10). For example, if the data message symbols are $$d = (3\ 0\ 1\ 0\ 0\ 4\ 3\ 1\ 4\ 0\ 2\ 1\ 3\ 3\ 0) \quad (19)$$

the non-systematic part of the codeword reads $$f = dA(0\ 2\ 0\ 4\ 4\ 0\ 0\ 4\ 0\ 0) \quad (20)$$

The data and parity array of (1) now becomes $$\begin{pmatrix} 3 & 0 & 3 & 0 & 3 \\ 0 & 0 & 1 & 2 & 3 \\ 1 & 4 & 4 & 1 & 0 \\ 0 & 0 & 4 & 0 & 0 \\ 2 & 4 & 0 & 4 & 0 \end{pmatrix}$$

Decoding. Assume that nodes 1 and 2 fail, hence F={1,2} and S={3,4,5}. The data messages of the surviving nodes can be directly recovered, which yields data vector $d_s$ of (11). The remaining data messages can be decoded by solving (17) for $$d_f = (d_{1,1}\ d_{2,1}\ d_{3,1}\ d_{1,2}\ d_{2,2}\ d_{3,2}) \quad (21)$$

Matrix (13) is given by $$A_s = \begin{pmatrix} 0 & 0| & 0 & 0| & 4 & 0 \\ 0 & 0| & 0 & 4| & 0 & 0 \\ 0 & 0| & 4 & 0| & 0 & 0 \\ \overline{0} & \overline{4}| & \overline{0} & \overline{0}| & \overline{0} & \overline{0} \\ 1 & 0| & 0 & 0| & 0 & 3 \\ 0 & 0| & 0 & 0| & 3 & 0 \\ \overline{0} & \overline{0}| & \overline{0} & \overline{3}| & \overline{0} & \overline{0} \\ 0 & 0| & 3 & 0| & 0 & 0 \\ 0 & 3| & 0 & 0| & 0 & 0 \end{pmatrix} \quad (22)$$

and matrix (14) reads $$A_f = \begin{pmatrix} 1 & 0| & 0 & 0| & 0 & 1 \\ 0 & 0| & 0 & 0| & 1 & 0 \\ 0 & 0| & 0 & 1| & 0 & 0 \\ \overline{0} & \overline{0}| & \overline{1} & \overline{0}| & \overline{0} & \overline{0} \\ 0 & 1| & 0 & 0| & 0 & 0 \\ 1 & 0| & 0 & 0| & 0 & 4 \end{pmatrix} \quad (23)$$

Then, by applying Algorithm 1, after calculating $$f'_s = f_s - d_s A_s = (f'_{1,2}\ f'_{2,2}\ f'_{1,4}\ f'_{2,4}\ f'_{1,5}\ f'_{2,5}) = (2 \quad (24)$$

it can be seen that 4 of the 6 unknowns in (21) are given by $$d_{2,1} = f'_{1,5} = 0$$

$$d_{3,1} = f'_{2,4} = 1$$

$$d_{1,2} = f'_{1,4} = 0$$

$$d_{2,2} = f'_{2,2} = 0 \quad (25)$$

while the other 2 unknowns are found by solving the 2×2 system $$(d_{1,1} \ d_{3,2}) \begin{pmatrix} 1 & 1 \\ 1 & 4 \end{pmatrix} = (f'_{1,2} \ f'_{2,5}) = (2 \ 4) \quad (26)$$

which yields $$d_{1,1} = 3$$

$$d_{3,2} = 4 \quad (27)$$

Combining (25) and (27), it can be seen that all erased data has been recovered.

The proposed codes can handle any number of nodes and failures while still being optimal. This allows for flexibility when employing them in, e.g., sensor networks for smart grid where the number of nodes is not a design parameter but is given by the application.

Figure 3:
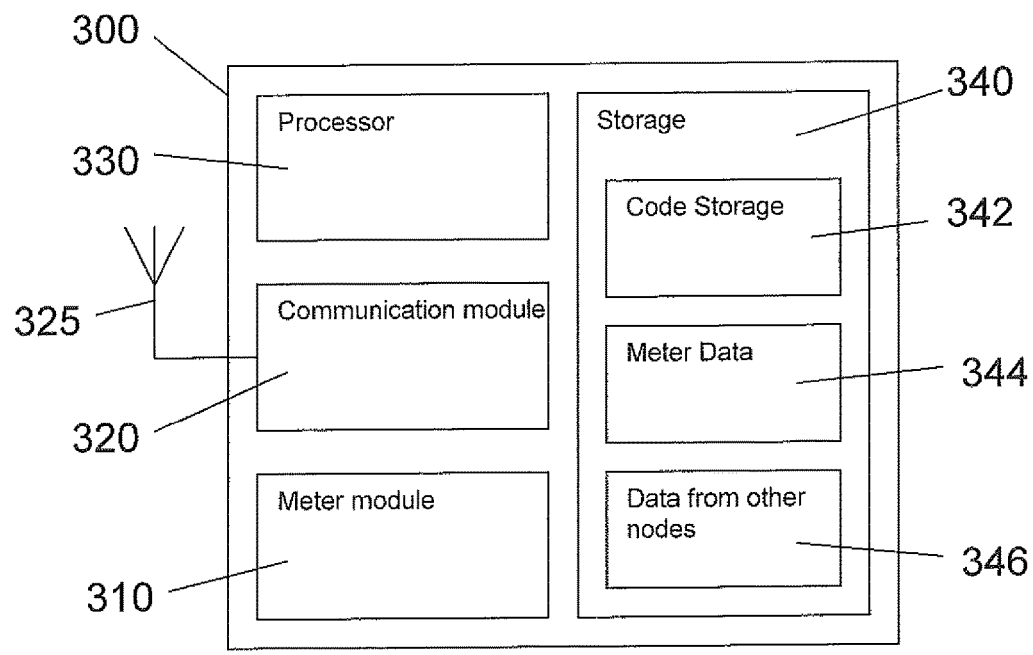
FIG. 3 shows a smart meter according to an embodiment.

FIG. 3 shows a smart meter according to an embodiment. The smart meter 300 functions as a node in the network 100 shown in FIG. 1. The smart meter 300 has a meter module 310, a communication module 320, a processor 330 and storage 340. The meter module 310 is configured to monitor energy usage. The communications module is coupled to an antenna 325 and can transmit and receive signals over a wireless network using a wireless protocol such as IEEE802.11n. The storage 340 includes code storage 342, storage for meter data 344 and storage for data received from other nodes 346. The storage may be implemented as volatile memory, non-volatile memory or a combination of both.

In an embodiment, the code storage 342 stores an indexed set of erasure codes and the communications module 320 is operable to receive an indication of an erasure code from the set from the concentrator node.

In an embodiment, the code storage stores an erasure code or a part of a coding matrix which is received over the wireless network from the concentrator node.

The process by which the indication of the erasure code is selected is described in more detail below with reference to FIGS. 5 and 6.

The processor is operable to generate erasure code blocks encoded using the erasure codes described above which have data symbols indicating the meter data 344 and parity blocks determined from the data from other nodes 346.

Figure 4:
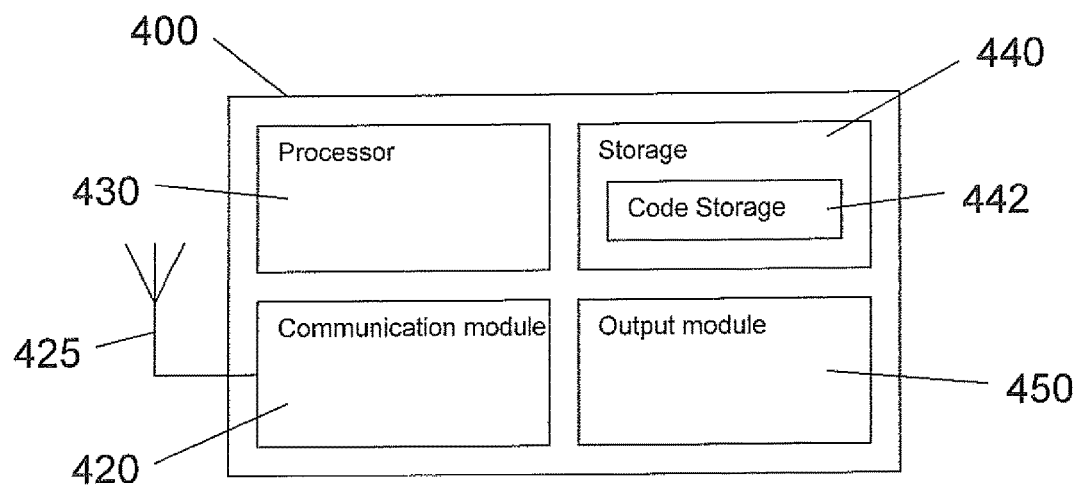
FIG. 4 shows a concentrator node according to an embodiment.

FIG. 4 shows a concentrator node 400 according to an embodiment. The concentrator node 400 has a communications module 420, a processor 430, storage 440 and an output module 450. The communication module 420 is coupled to an antenna 425 and can transmit and receive signals over a wireless network using a wireless protocol such as IEEE802.11n. The storage 440 comprises code storage 442.

In an embodiment the code storage 442 of the concentrator node 400 stores an indexed set of erasure codes and the processor is operable to select one of the indexed erasure codes during an initialisation process.

In an embodiment the processor is operable to generate an erasure code during an initialisation process.

The initialisation process is described in more detail below with reference to FIGS. 5 and 6.

Figure 5:
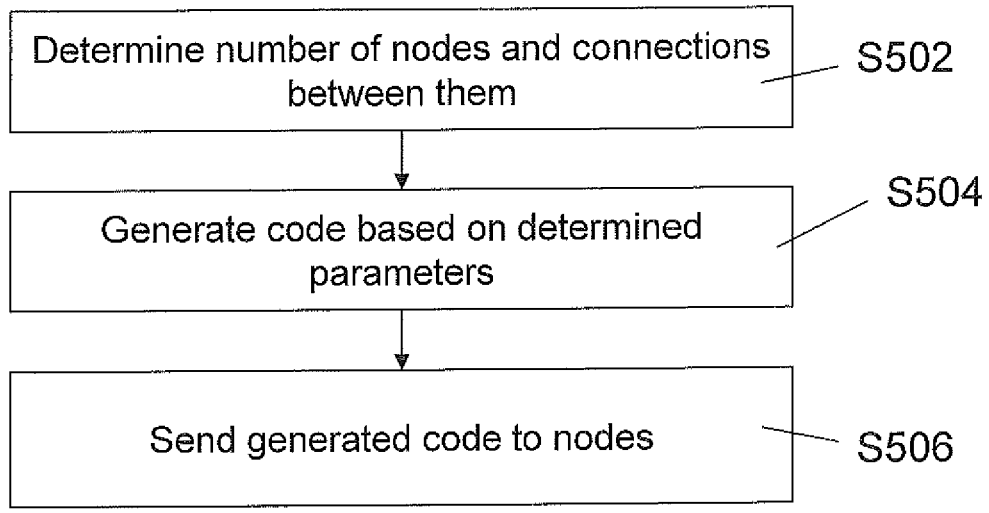
FIG. 5 shows an initialisation method of a sensor network according to an embodiment.

FIG. 5 shows an initialisation method according to an embodiment. The steps of the method shown in FIG. 5 are carried out by the concentrator node 400.

In step S502 the concentrator node 400 determines the number of nodes in the network and the connections between them.

In step S504 the processor 430 of the concentrator node 400 generates a code based on the determined number of nodes. As discussed above, the methods described herein allow MDS codes that have the lowest possible density to be constructed for any number of nodes and that are tolerant of any number of failures. The number of failures may be selectable or may be preset.

In step S506 the generated code is sent to the nodes using the communication module 420 of the concentrator node 400. The code may be sent by sending the coding matrix A to all of the nodes. In an embodiment, the concentrator node sends just the required columns of the coding matrix to each of the nodes.

Figure 6:
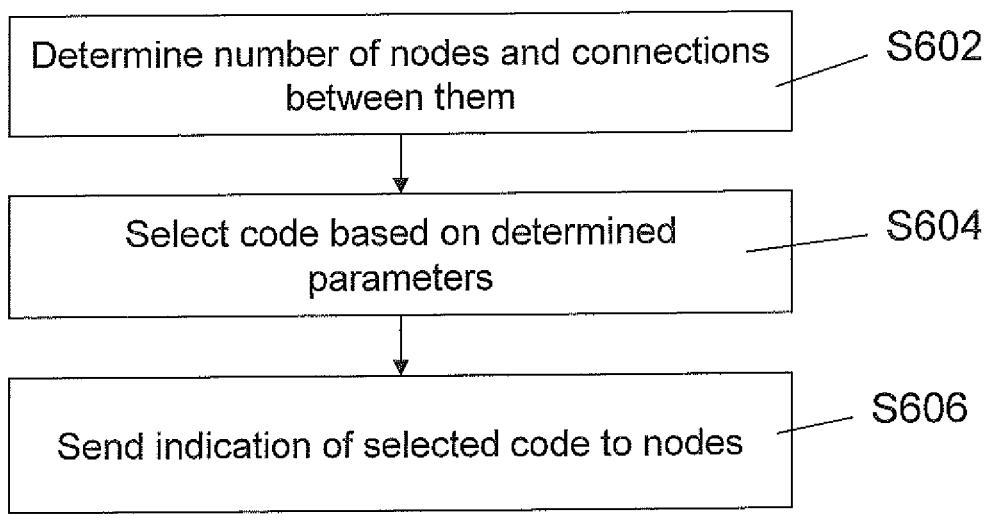
FIG. 6 shows an initialisation method of a sensor network according to an embodiment.

FIG. 6 shows an initialisation method according to an embodiment. In the method shown in FIG. 6, each of the nodes stores a set of codes that have been pre-calculated using the methods described above. The codes are pre-calculated for different numbers of nodes and may also be pre-calculated for different numbers of failures.

In step S602 the concentrator node 400 determines the number of nodes in the network and the connections between them.

In step S604, the processor selects a stored code based on the number of nodes determined in step S602 and determines an index value indicating the selected code.

In step S606, the concentrator node sends the index value indicating the selected code to the nodes of the network. The nodes of the network also store the indexed set of codes so the selected code can be obtained by the nodes using the index.

Figure 7:
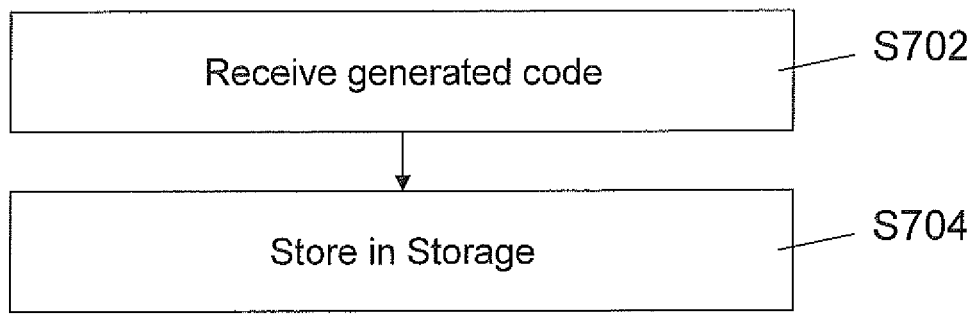
FIG. 7 shows a method carried out on a node of a sensor network in response to the initialisation process in accordance with an embodiment.

FIG. 7 shows a method carried out on a node in response to the initialisation process on the concentrator node according to an embodiment.

In step S702 the node 300 receives a code generated by the concentrator node 400. The code is generated by the concentrator node 400 according to the method described above with reference to FIG. 5.

In step S704 the node 300 stores the received code in the code storage 342 of the node 300. As discussed above, the node may store just the required parts of the coding matrix A constructed according to equation (7) above.

Figure 8:
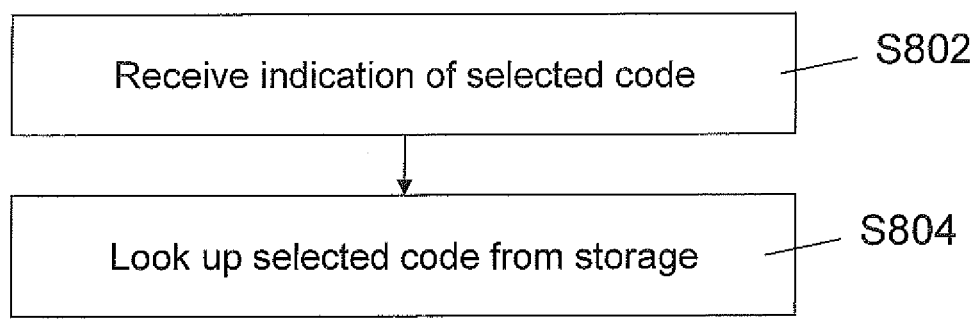
FIG. 8 shows a method carried out on a node of a sensor network in response to the initialisation process in accordance with an embodiment.

FIG. 8 shows a method carried out on a node in response to the initialisation process on the concentrator node according to an embodiment.

In step S802 the node 300 receives an indication of a code selected by the concentrator node 400. The indication indicates a code stored in the code storage 342 of the node 400. The indication of the code is generated by the concentrator node 400 according to the method described above with reference to FIG. 6.

In step S804 the node 300 uses the indication to determine which code stored in the code storage 342 to use when encoding.

Figure 9:
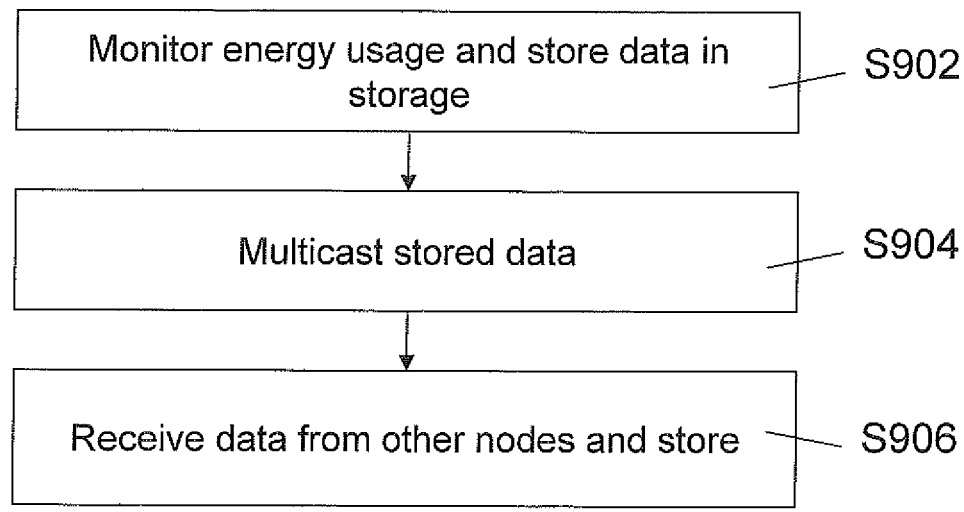
FIG. 9 shows a method of monitoring energy usage according to an embodiment.

FIG. 9 shows a method of monitoring energy usage carried out by the nodes of a sensor network according to an embodiment.

In step S902 the meter module 310 monitors energy usage and stores data indicating the energy usage in as meter data 344 in the storage 340.

In step S904 the communication module 320 multicasts the meter data 344 stored in the storage 340 to neighbouring nodes.

In step S906 the communication module 320 receives data from other nodes. The received data is stored as data received from other nodes 346 in the storage 340.

Periodically, or in response to a request from the concentrator node, the nodes of the network generate blocks using the stored meter data and the stored data received from other nodes.

Figure 10:
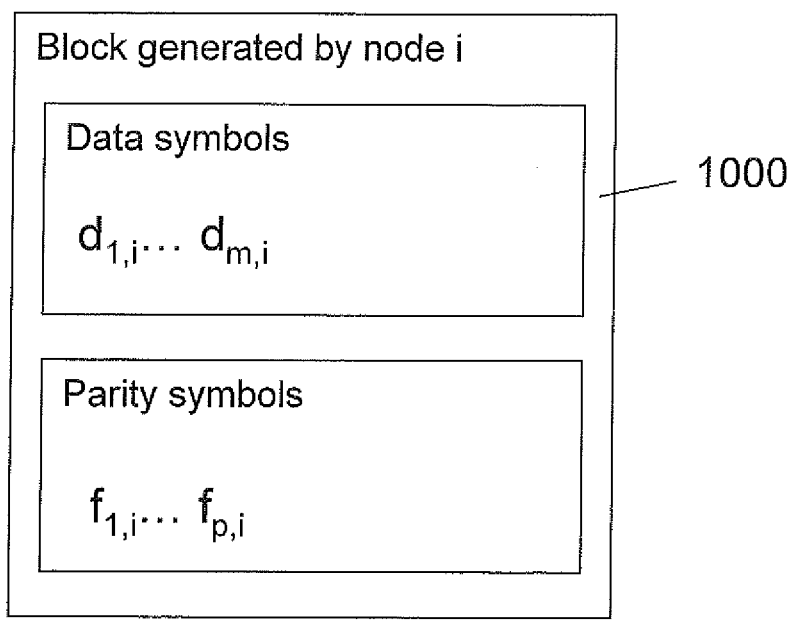
FIG. 10 shows a method of monitoring energy usage according to an embodiment.

FIG. 10 shows a block 1000 generated by a node i of the sensor network. The block 1000 includes data symbols $d_{1,i} \ldots d_{m,i}$ and parity symbols $f_{1,i} \ldots f_{p,i}$. The data symbols are the meter data 344 stored on the node 300. The parity symbols are generated according to equation (10) above using the erasure code generated or selected by the concentrator node.

The concentrator node receives blocks generated by the nodes of the network and uses the parity data from the received blocks to recreate the data from any erased blocks using the method described above in relation to equation (17).

As described above embodiments allow erasure codes to be generated for networks with any numbers of nodes and for any number of failed or erased blocks. Thus embodiments provide a coding scheme that can be configured to be efficient and adaptable to changes in the number of nodes in a network.

In the embodiments described above, the initialisation process is carried out on the concentrator node, however, embodiments are envisaged in which the initialisation process operates in a distributed fashion. In such embodiments there is cooperation between the nodes.

While the embodiments described above relate to monitoring of energy usage, those of skill in the art will appreciate that the coding schemes can be adapted for use in a variety of applications such as networks with high packet loss; video streaming over lossy channels; distributed network storage and redundant disk drives.

For example, one application is sending packets through a lossy channel. The data in the lost packets could be generated from the parity information of the received packets. In this example of the block erasure code could is used as a higher layer packet recovery mechanism whereby lost packets are recovered from the parity information of the received packets.

In this case the parameters would be determined based on some higher layer channel quality measurements, for example packet loss ratio or packet processing delay. An advantage of using the proposed block erasure code would be in the flexibility of the parameters choice.

The customisation of the coding parameters could be adapted depending on the network topology and other requirements, such as the level of protection needed and the maximum number of nodes involved in the coding operation. Before the code is generated there is a stage where the concentrator node (or a number of nodes in case of a distributed approach) acquires information on the network topology. This may be possible by using for example neighbour lists in routing protocols.

A decision is then made on the number of nodes involved in the failure protection scheme (parameter n), on the level of protection, i.e. how many block erasures the code should sustain (parameter r) and on the number of data symbols processed in parallel (parameter m).

While certain embodiments have been described, these embodiments have been presented by way of example only, and are not intended to limit the scope of the inventions. Indeed, the novel methods, systems, devices and networks described herein may be embodied in a variety of other forms; furthermore, various omissions, substitutions and changes may be made without departing from the spirit of the inventions. The accompanying claims and their equivalents are intended to cover such forms or modifications as would fall within the scope and spirit of the inventions.

The invention claimed is:

1. A sensor network comprising:
a concentrator node and a plurality of sensor nodes, wherein a first sensor node of the plurality of sensor nodes is configured to:
communicate data symbols from the first sensor node to the other sensor nodes of the plurality of sensor nodes in the sensor network,
receive data symbols from the other sensor nodes in the sensor network,
receive a request from the concentrator node for data symbols from the plurality of sensor nodes,
generate a block comprising a plurality of data symbols from the first sensor node and a plurality of parity symbols formed using data symbols from the other sensor nodes, and
send the generated block to the concentrator node;
wherein the concentrator node comprises a decoder for decoding a received set of blocks from the plurality of sensor nodes, wherein the received set of blocks is a subset of a complete set of blocks, the complete set of blocks comprising at least one block not included in the received set of blocks, the decoder comprising:
storage for a coding matrix which is the kronecker product of a totally non-singular matrix with an antidiagonal matrix; and
a processor operable to determine data symbols of the at least one block not included in the received set of blocks using the coding matrix.

2. A system according to claim 1 wherein the processor is operable to determine the data symbols of the at least one block not included in the received set of blocks by calculating the inverse of the coding matrix.

3. A system according to claim 1 wherein the processor is operable to determine rows and columns of the coding matrix corresponding to the at least one block not included in the received set of blocks and to determine the data symbols of the at least one block not included in the received set of blocks by calculating the inverse of a matrix formed from the rows and columns of the coding matrix corresponding to the at least one block not included in the received set of blocks.

4. A concentrator node of a sensor network, the sensor network comprising:
a plurality of sensor nodes and the concentrator mode, wherein a first sensor node of the plurality of sensor nodes is configured to:
communicate data symbols from the first sensor node to other sensor nodes of the plurality of sensor nodes in the sensor network,
receive data symbols from the other sensor nodes in the sensor network,
receive a request from the concentrator node for data symbols from the plurality of sensor nodes, generate a block comprising a plurality of data symbols from the first sensor node and a plurality of parity symbols formed using data symbols from the other sensor nodes, and send the generated block to the concentrator node;

wherein the concentrator node comprises a decoder for decoding a received set of blocks from the plurality of sensor nodes, wherein the received set of blocks is a subset of a complete set of blocks, the complete set of blocks comprising at least one block not included in the received set of blocks, the decoder comprising:

storage for a coding matrix which is the kronecker product of a totally non-singular matrix with an antidiagonal matrix; and a processor operable to determine data symbols of the at least one block not included in the received set of blocks using the coding matrix.

5. A concentrator node according to claim 4, wherein the decoder is operable to determine the number of sensor nodes in the plurality of sensor nodes and to generate the coding matrix taking into account the number of sensor nodes in the plurality of sensor nodes.

6. A concentrator node according to claim 5, wherein the decoder is operable to send an indication of the generated coding matrix to each sensor node of the plurality of nodes.

7. A concentrator node according to claim 4, wherein the decoder further comprises storage for a plurality of coding matrices and wherein the decoder is operable to determine the number of sensor nodes in the plurality of sensor nodes and to select the coding matrix from the plurality of coding matrices taking into account the number of sensor nodes in the plurality of nodes.

8. A concentrator node according to claim 7, wherein the decoder is further operable to send an indication of the selected coding matrix to each sensor node of the plurality of sensor nodes.

9. A sensor node of a sensor network, the sensor network comprising:

a plurality of sensor nodes and a concentrator mode, wherein a first sensor node of the plurality of sensor nodes is configured to:

communicate data symbols from the sensor node to the other sensor nodes of the plurality of sensor nodes in the sensor network, receive data symbols from the other sensor nodes in the sensor network, receive a request from the concentrator node for data symbols from the plurality of sensor nodes, generate a block comprising a plurality of data symbols from the first sensor node and a plurality of parity symbols formed using data symbols from the other sensor nodes using an encoder, and send the generated block to the concentrator node;

wherein the encoder is configured to set the plurality of parity symbols using a combination of the data symbols received from other sensor nodes in the sensor network, and a column of a coding matrix which is the kronecker product of a totally non-singular matrix with an antidiagonal matrix.

10. A sensor node according to claim 9, wherein the encoder further comprises a communication module configured to receive at least part of the coding matrix.

11. A sensor node according to claim 9, wherein the encoder further comprises storage for a plurality of coding matrices, wherein the encoder is configured to select a coding matrix from the plurality of coding matrices for setting the parity symbols of the block.

12. A sensor node according to claim 11, wherein the encoder further comprises a communication module configured to receive an indication of a coding matrix from the plurality of coding matrices, wherein the encoder is configured to select the coding matrix from the plurality of coding matrices for setting the parity symbols of the block according to the indication.

13. A smart meter comprising the sensor of claim 9.

* * * * *